United States Patent
Ogata et al.

(10) Patent No.: US 11,972,894 B2
(45) Date of Patent: Apr. 30, 2024

(54) POWER DIVIDER

(71) Applicant: Murata Manufacturing Co., Ltd., Nagaokakyo (JP)

(72) Inventors: Makoto Ogata, Nagaokakyo (JP); Takuya Sato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 430 days.

(21) Appl. No.: 17/318,154

(22) Filed: May 12, 2021

(65) Prior Publication Data

US 2021/0265105 A1    Aug. 26, 2021

Related U.S. Application Data

(63) Continuation of application No. PCT/JP2019/047980, filed on Dec. 9, 2019.

(30) Foreign Application Priority Data

Dec. 12, 2018 (JP) .................. 2018-232073

(51) Int. Cl.
*H01F 27/40* (2006.01)
*H01F 27/28* (2006.01)
(Continued)

(52) U.S. Cl.
CPC ......... *H01F 27/40* (2013.01); *H01F 27/2804* (2013.01); *H01F 27/29* (2013.01);
(Continued)

(58) Field of Classification Search
CPC .. H01F 27/00–427; H01G 17/00; H01G 4/40; H01L 25/0657; H01L 27/00; H01L 27/013; H01L 27/016
See application file for complete search history.

(56) References Cited

U.S. PATENT DOCUMENTS

| | | | | |
|---|---|---|---|---|
| 5,650,756 A | * | 7/1997 | Hayashi | ............ H01G 4/40 333/100 |
| 6,748,207 B1 | * | 6/2004 | Tochigi | ............ H01P 5/16 455/334 |

(Continued)

FOREIGN PATENT DOCUMENTS

| JP | 61-123201 A | 6/1986 |
|---|---|---|
| JP | 63-144724 U | 9/1988 |

(Continued)

OTHER PUBLICATIONS

Official Communication issued in International Patent Application No. PCT/JP2019/047980, dated Jan. 28, 2020.

*Primary Examiner* — Jared Fureman
*Assistant Examiner* — Christopher J Clark
(74) *Attorney, Agent, or Firm* — Keating & Bennett, LLP (57) ABSTRACT

A power divider includes a first inductor connected between a first terminal and a second terminal, a second inductor connected between the first terminal and a third terminal, a resistor connected between a second terminal side of the first inductor and a third terminal side of the second inductor, a third inductor connected between a connection portion between the first inductor and the resistor, and the second terminal, a fourth inductor connected between a connection portion between the second inductor and the resistor, and the third terminal, a fourth capacitor connected in parallel with the resistor, and a fifth capacitor connected between the second terminal and the third terminal.

18 Claims, 3 Drawing Sheets

(51) Int. Cl.
  *H01F 27/29* (2006.01)
  *H01F 27/32* (2006.01)
  *H01G 4/30* (2006.01)
  *H01G 4/40* (2006.01)
  *H01P 5/12* (2006.01)

(52) U.S. Cl.
  CPC .............. *H01F 27/323* (2013.01); *H01G 4/30* (2013.01); *H01G 4/40* (2013.01); *H01P 5/12* (2013.01); *H01F 2027/2809* (2013.01)

(56) References Cited

U.S. PATENT DOCUMENTS

| | | |
|---|---|---|
| 2017/0047904 A1 | 2/2017 | Szopko |
| 2017/0373367 A1 | 12/2017 | Asada |
| 2021/0167482 A1* | 6/2021 | Ogata ..................... H03H 7/48 |

FOREIGN PATENT DOCUMENTS

| | | |
|---|---|---|
| JP | 03-165110 A | 7/1991 |
| JP | 07-106898 A | 4/1995 |
| JP | 2001-016063 A | 1/2001 |
| JP | 2002-280864 A | 9/2002 |
| JP | 2007-174376 A | 7/2007 |
| JP | 2008-017159 A | 1/2008 |
| JP | 2018-006790 A | 1/2018 |
| JP | 2018-532286 A | 11/2018 |
| WO | 2015/022839 A1 | 2/2015 |

* cited by examiner

POWER DIVIDER

CROSS REFERENCE TO RELATED APPLICATIONS

This application claims the benefit of priority to Japanese Patent Application No. 2018-232073 filed on Dec. 12, 2018 and is a Continuation Application of PCT Application No. PCT/JP2019/047980 filed on Dec. 9, 2019. The entire contents of each application are hereby incorporated herein by reference.

BACKGROUND OF THE INVENTION

1. Field of the Invention

The present invention relates to a power divider including a Wilkinson divider.

2. Description of the Related Art

Japanese Patent Application Laid-Open No. 2002-280864 and Japanese Patent Application Laid-Open No. 2001-16063 disclose a circuit that divides a radio frequency signal with a Wilkinson divider.

The Wilkinson divider includes a first terminal, a second terminal, a third terminal, a first inductor, a second inductor, and a resistor as a basic configuration. The first inductor is connected between the first terminal and the second terminal, and the second inductor is connected between the first terminal and the third terminal. The resistor is connected between the second terminal and the third terminal.

In the circuit disclosed in Japanese Patent Application Laid-Open No. 2002-280864, a capacitor is connected in parallel with each of the first inductor and the second inductor. With this configuration, isolation between the second terminal and the third terminal is improved.

In the circuit disclosed in Japanese Patent Application Laid-Open No. 2001-16063, a T-type low-pass filter including an inductor and a capacitor is connected between the resistor and the second terminal and between the resistor and the third terminal. With this configuration, the reflection characteristics are improved without deteriorating the insertion loss.

However, in recent years, communication terminals are required to have further improvement in communication performance. In the circuit configurations disclosed in Japanese Patent Application Laid-Open No. 2002-280864 and Japanese Patent Application Laid-Open No. 2001-16063, a situation in which favorable isolation characteristics between the second terminal and the third terminal are not obtained may occur.

SUMMARY OF THE INVENTION

Preferred embodiments of the present invention provide power dividers each achieving further improved isolation characteristics.

According to a preferred embodiment of the present invention, a power divider includes a first terminal, a second terminal, a third terminal, a first inductor, a second inductor, a third inductor, a fourth inductor, a first capacitor, a second capacitor, a third capacitor, a fourth capacitor, a fifth capacitor, and a resistor.

The first inductor is connected between the first terminal and the second terminal. The second inductor is connected between the second terminal and the third terminal. The first capacitor is connected between a second terminal side of the first inductor and a ground. The second capacitor is connected between a third terminal side of the second inductor and the ground. The third capacitor is connected between the first terminal and the ground. The resistor is connected between the second terminal side of the first inductor and the third terminal side of the second inductor. The third inductor is connected between a connection portion between the first inductor and the resistor, and the second terminal. The fourth inductor is connected between a connection portion between the second inductor and the resistor, and the third terminal. The fourth capacitor is connected in parallel with the resistor. The fifth capacitor is connected between the second terminal and the third terminal.

With this configuration, an attenuation pole different from an attenuation pole of a circuit including the first inductor, the second inductor, the third inductor, the first capacitor, the second capacitor, and the third capacitor, and the resistor is provided by adding the third inductor, the fourth inductor, the third capacitor, and the fourth capacitor. By adjusting the attenuation pole, characteristics, for example, increasing an attenuation amount and widening a frequency band in which the attenuation amount is relatively large, are achieved.

According to preferred embodiments of the present invention, it is possible to further improve the isolation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

Circuit Configuration

Figure 1:
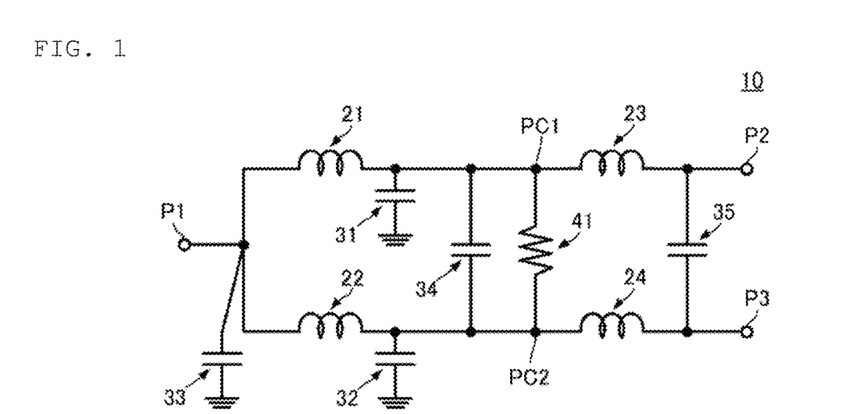
FIG. 1 is a circuit diagram of a power divider 10 according to a preferred embodiment of the present invention.

FIG. 1 is a circuit diagram of a power divider 10 according to a preferred embodiment of the present invention. As illustrated in FIG. 1, the power divider 10 includes a first terminal P1, a second terminal P2, and a third terminal P3. The power divider 10 further includes a first inductor 21, a second inductor 22, a third inductor 23, and a fourth inductor 24. The power divider 10 further includes a first capacitor 31, a second capacitor 32, a third capacitor 33, a fourth capacitor 34, and a fifth capacitor 35. The power divider 10 further includes a resistor 41.

The first inductor 21 is connected between the first terminal P1 and the second terminal P2. The second inductor 22 is connected between the first terminal P1 and the third terminal P3.

The first capacitor 31 is connected between the second terminal P2 side of the first inductor 21 and the ground (ground potential). The second capacitor 32 is connected between the third terminal P3 side of the second inductor 22 and the ground. The third capacitor 33 is connected between the first terminal P1 and the ground.

The resistor 41 is connected between the second terminal P2 side of the first inductor 21 and the third terminal P3 side of the second inductor 22.

The third inductor 23 is connected between a connection portion PC1 between the first inductor 21 and the resistor 41, and the second terminal P2. The fourth inductor 24 is connected between a connection portion PC2 between the second inductor 22 and the resistor 41, and the third terminal P3.

The fourth capacitor 34 is connected in parallel with the resistor 41. The fifth capacitor 35 is connected between the second terminal P2 side of the third inductor 23 and the third terminal P3 side of the fourth inductor 24.

The inductance of the first inductor 21 is equal or substantially equal to the inductance of the second inductor 22. The capacitance of the first capacitor 31 is equal or substantially equal to the capacitance of the second capacitor 32. The inductance of the third inductor 23 is equal or substantially equal to the inductance of the fourth inductor 24. The resistance value of the resistor 41 is a predetermined value, for example, about 100Ω.

As described above, the power divider 10 has a configuration in which a second circuit defined by the third inductor 23, the fourth inductor 24, the fourth capacitor 34, and the fifth capacitor 35 is added to a general basic Wilkinson divider (first circuit) including the first inductor 21, the second inductor 22, the first capacitor 31, the second capacitor 32, the third capacitor 33, and the resistor 41.

Thus, with this configuration, the power divider 10 divides and outputs a radio frequency signal of a desired frequency, which is input from the first terminal P1, to the second terminal P2 and the third terminal P3. The power divider 10 combines a radio frequency signal of the desired frequency, which is input from the second terminal P2, and a radio frequency signal of the desired frequency, which is input from the third terminal, and outputs the resultant of the combination to the first terminal P1. That is, the power divider 10 achieves the division of a radio frequency signal and the combination of a radio frequency signal.

Isolation Characteristics

Figure 2:
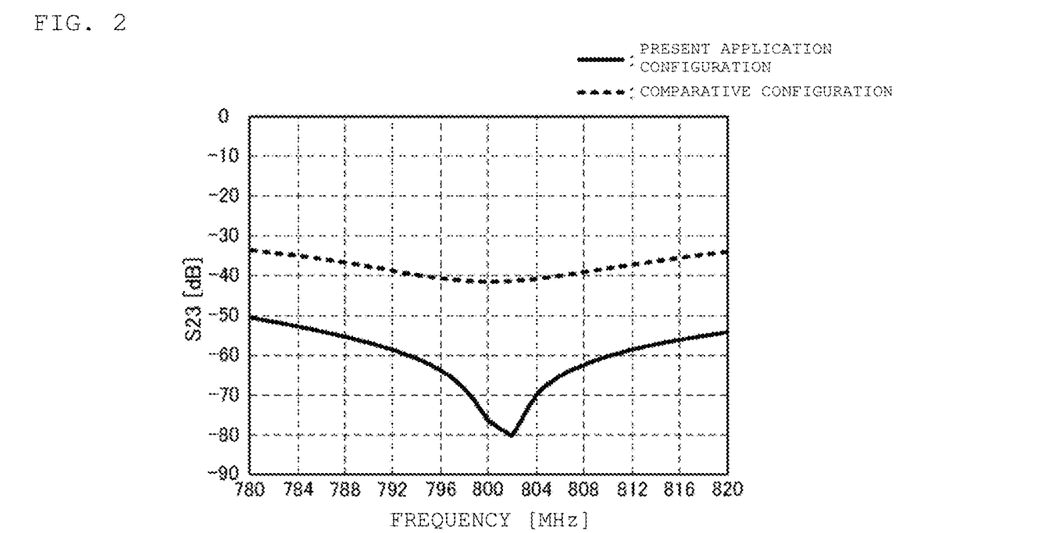
FIG. 2 is a graph illustrating a first characteristic of the power divider 10.
Figure 3:
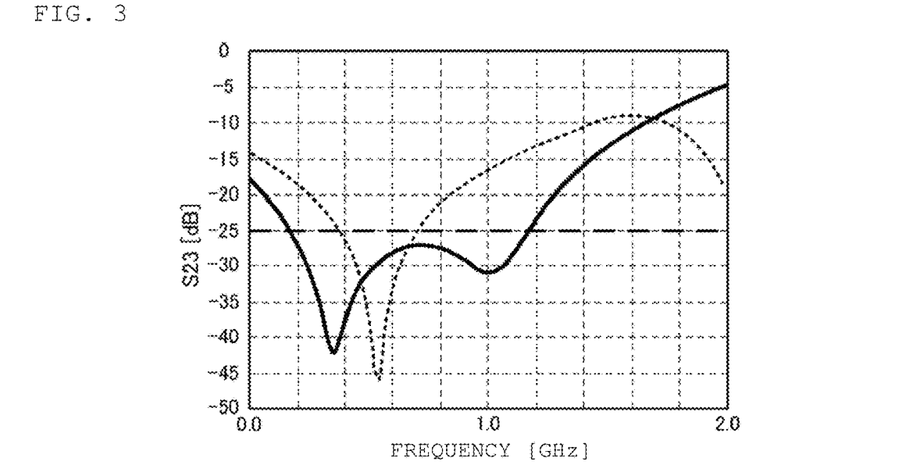
FIG. 3 is a graph illustrating a second characteristic of the power divider 10.

With such a configuration, the power divider 10 can obtain isolation characteristics as illustrated in FIG. 2 or FIG. 3. FIG. 2 is a graph illustrating a first characteristic of the power divider 10. FIG. 3 is a graph illustrating a second characteristic of the power divider 10. The element value (inductance and capacitance) of each circuit element of the power divider 10 is different between the first characteristic and the second characteristic. In FIGS. 2 and 3, a horizontal axis represents the frequency, and a vertical axis represents the attenuation amount between the second terminal P2 and the third terminal P3. The larger the attenuation amount on the vertical axis, that is, the smaller the numerical value on the vertical axis, the higher the isolation characteristics between the second terminal P2 and the third terminal P3. The comparative configurations illustrated in FIGS. 2 and 3 are based on the circuit configuration of a general basic Wilkinson divider.

First Characteristic (Large Attenuation Amount at Attenuation Pole)

As illustrated in FIG. 2, if the inductance of the first inductor 21, the inductance of the second inductor 22, the inductance of the third inductor 23, the inductance of the fourth inductor 24, the capacitance of the first capacitor 31, the capacitance of the second capacitor 32, the capacitance of the third capacitor 33, the capacitance of the fourth capacitor 34, and the capacitance of the fifth capacitor 35 are set to have a first relationship, it is possible to set the attenuation amount at an attenuation pole to be greater than that in the comparative configuration. That is, it is possible to improve the isolation characteristics. This is achieved by setting a plurality of attenuation poles with a predetermined attenuation amount to be close or equal to each other (see FIG. 2).

As an example, regarding the characteristic in FIG. 2, the inductance of the first inductor 21 and the inductance of the second inductor 22 are about 10.63 nH, and the inductance of the third inductor 23 and the inductance of the fourth inductor 24 are about 8.12 nH. The capacitance of the first capacitor 31 and the capacitance of the second capacitor 32 are about 1.30 pF, and the capacitance of the third capacitor 33 is about 2.59 pF, for example. The capacitance of the fourth capacitor 34 is about 0.08 pF, and the capacitance of the fifth capacitor 35 is about 0.27 pF, for example. Such element values are examples. As long as the relationship is the same as or similar to the above relationships, it is possible to obtain the characteristic the same as or similar to that in FIG. 2 and also to adjust the frequency of the attenuation pole.

Second Characteristic (Wide Frequency Band where Predetermined Attenuation Amount can be Obtained)

As illustrated in FIG. 3, if the inductance of the first inductor 21, the inductance of the second inductor 22, the inductance of the third inductor 23, the inductance of the fourth inductor 24, the capacitance of the first capacitor 31, the capacitance of the second capacitor 32, the capacitance of the third capacitor 33, the capacitance of the fourth capacitor 34, and the capacitance of the fifth capacitor 35 are set to have a second relationship, it is possible to set the frequency band in which a predetermined attenuation amount (for example, about −25 dB) can be obtained, to be wider than that in the comparative configuration. That is, it is possible to improve the isolation characteristics in a wide frequency band. This is achieved by setting a plurality of attenuation poles with a predetermined attenuation amount, to be spaced apart from each other by a predetermined frequency band width (see FIG. 3).

As an example, regarding the characteristic in FIG. 3, the inductance of the first inductor 21 and the inductance of the second inductor 22 are about 13.68 nH, and the inductance of the third inductor 23 and the inductance of the fourth inductor 24 are about 7.87 nH. The capacitance of the first capacitor 31 and the capacitance of the second capacitor 32 are about 2.40 pF, and the capacitance of the third capacitor 33 is about 2.69 pF, for example. The capacitance of the fourth capacitor 34 is about 1.30 pF, and the capacitance of the fifth capacitor 35 is about 1.28 pF, for example. Such element values are examples. As long as the relationship is the same as or similar to the above relations, it is possible to obtain the characteristics the same as or similar to that in FIG. 3 and also to adjust the frequency of the attenuation pole and the frequency bandwidth in which the predetermined attenuation amount can be obtained.

As described above, in the power divider 10 according to the present preferred embodiment, it is possible to further improve the isolation characteristics as compared with a circuit configuration in the related art.

Structure of Power Divider 10

Figure 4:
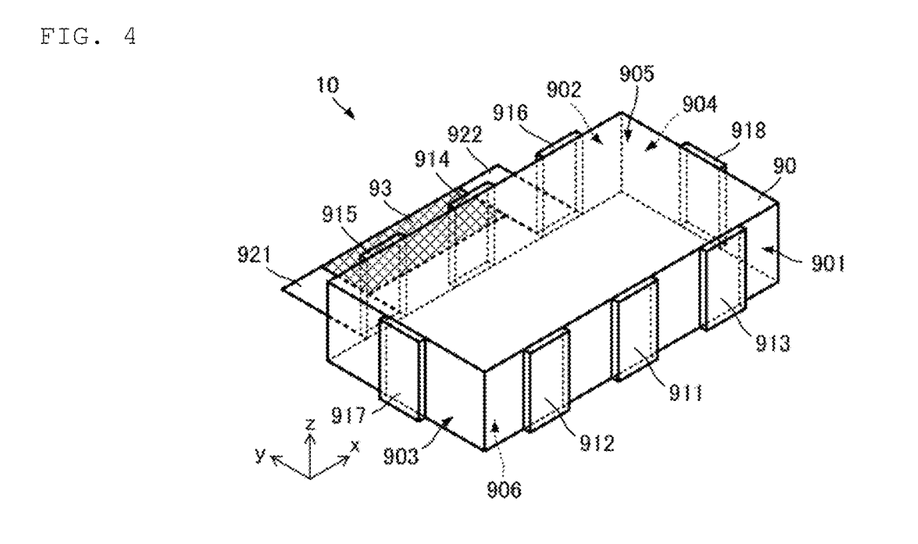
FIG. 4 is an external perspective view of the power divider 10.
Figure 5A:
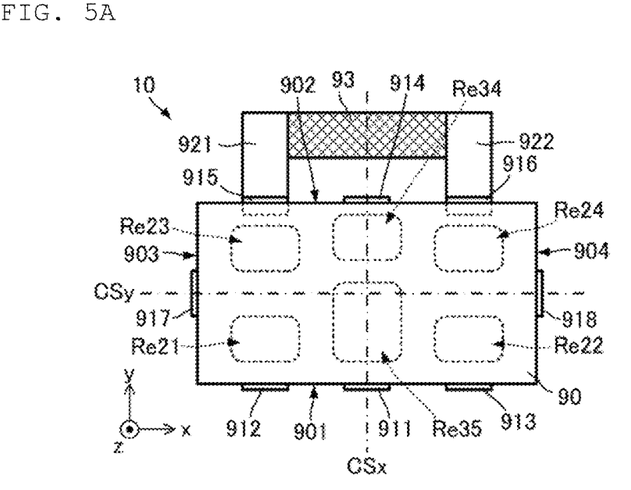
FIG. 5A is a plan view of the power divider 10.
Figure 5B:
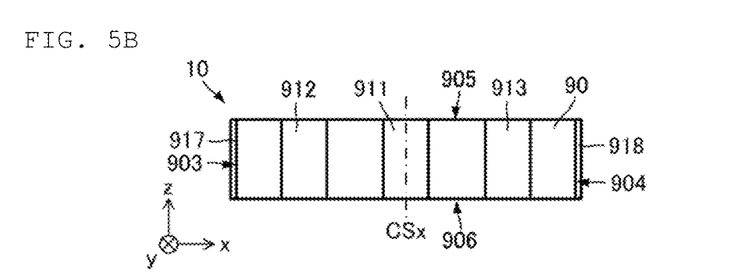
FIG. 5B is a side view when a first side surface of the power divider 10 is viewed.
Figure 5C:
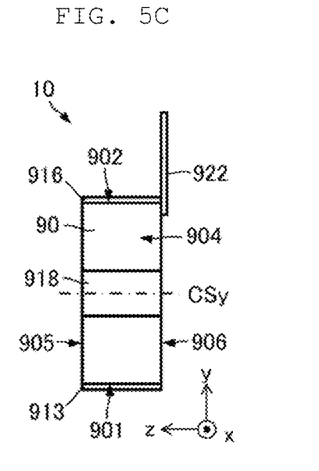
FIG. 5C is a side view when a fourth side surface of the power divider 10 is viewed.
Figure 6:
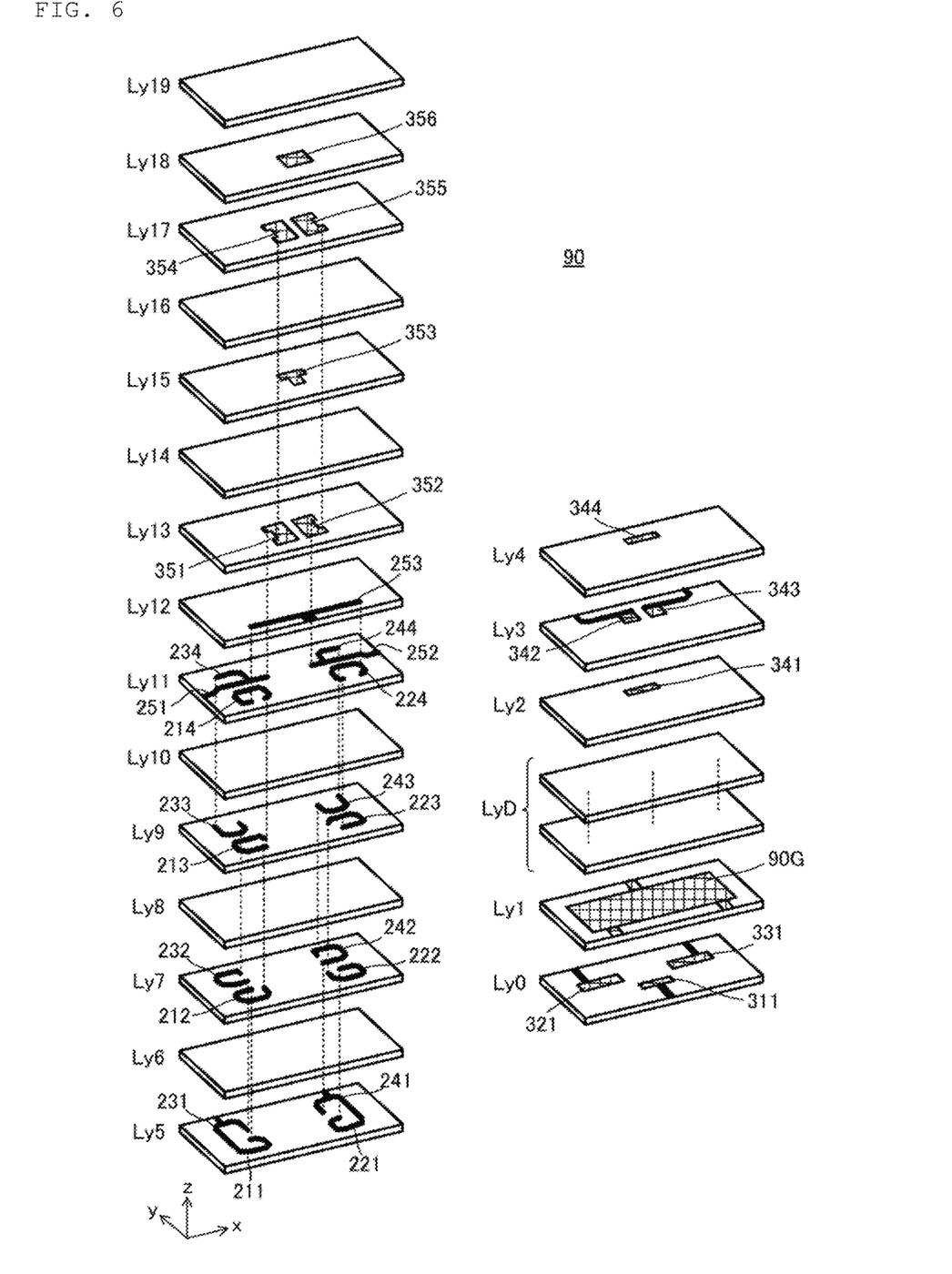
FIG. 6 is an exploded perspective view of a substrate in the power divider 10.

FIG. 4 is an external perspective view of the power divider 10. FIG. 5A is a plan view of the power divider 10, FIG. 5B is a side view when a first side surface of the power divider 10 is viewed, and FIG. 5C is a side view when a fourth side surface of the power divider 10 is viewed. FIG. 6 is an exploded perspective view of a substrate in the power divider 10.

As illustrated in FIGS. 4 and 5A to 5C, the power divider includes a substrate 90. The substrate 90 is a laminate including a plurality of insulators that are, and a predetermined circuit conductor pattern is provided in the substrate. With this configuration, circuit components other than the resistor 41 in the power divider 10 are provided in the substrate 90. The predetermined circuit conductor pattern and the resistor 41 may be provided in a silicon on insulator (SOI), for example.

The substrate 90 is a rectangular or substantially rectangular parallelepiped and includes a first side surface 901, a second side surface 902, a third side surface 903, a fourth side surface 904, a first main surface 905, and a second main surface 906. The first main surface 905 and the second main surface 906 are perpendicular or substantially perpendicular to a height direction (z-direction) of the substrate 90. The first main surface 905 and the second main surface 906 are parallel or substantially parallel to each other and are spaced from each other in the z-direction. The first side surface 901 and the second side surface 902 are parallel or substantially parallel to an x-direction perpendicular or substantially perpendicular to the z-direction. The first side surface 901 and the second side surface 902 are parallel or substantially parallel to each other and are spaced apart from each other in a y-direction perpendicular or substantially perpendicular to the z-direction and the x-direction. The third side surface 903 and the fourth side surface 904 are parallel or substantially parallel to the y-direction. The third side surface 903 and the fourth side surface 904 are parallel or substantially parallel to each other and spaced apart from each other in the x-direction.

A first side conductor 911, a second side conductor 912, and a third side conductor 913 are provided on the first side surface 901 of the substrate 90. The first side conductor 911, the second side conductor 912, and the third side conductor 913 are rectangular or substantially rectangular flat films extending in the z-direction.

The first side conductor 911 is disposed at a position including the center CSx of the first side surface 901 in the x-direction. The first side conductor 911 defines and functions as the first terminal P1 on the circuit. The second side conductor 912 is disposed on the third side surface 903 side of the first side conductor 911. The third side conductor 913 is disposed on the fourth side surface 904 side of the first side conductor 911. The distance between the second side conductor 912 and the first side conductor 911 (distance in the x-direction) is equal or substantially equal to the distance between the third side conductor 913 and the first side conductor 911 (distance in the x-direction).

A fourth side conductor 914, a fifth side conductor 915, and a sixth side conductor 916 are provided on the second side surface 902 of the substrate 90. The fourth side conductor 914, the fifth side conductor 915, and the sixth side conductor 916 are rectangular or substantially rectangular flat films extending in the z-direction.

The fourth side conductor 914 is disposed at a position including the center CSx of the second side surface 902 in the x-direction. The fifth side conductor 915 is disposed on the third side surface 903 side of the fourth side conductor 914. The sixth side conductor 916 is disposed on the fourth side surface 904 side of the fourth side conductor 914. The distance between the fifth side conductor 915 and the fourth side conductor 914 (distance in the x-direction) is equal or substantially equal to the distance between the sixth side conductor 916 and the fourth side conductor 914 (distance in the x-direction).

When the substrate 90 is viewed in the y-direction, the fourth side conductor 914 overlaps with the first side conductor 911. The fifth side conductor 915 overlaps the second side conductor 912. The sixth side conductor 916 overlaps the third side conductor 913.

A seventh side conductor 917 is provided on the third side surface 903 of the substrate 90. The seventh side conductor 917 is a rectangular or substantially rectangular flat film extending in the z-direction. The seventh side conductor 917 is disposed at a position including the center CSy of the third side surface 903 in the y-direction. The seventh side conductor 917 defines and functions as the second terminal P2 on the circuit.

An eighth side conductor 918 is provided on the fourth side surface 904 of the substrate 90. The eighth side conductor 918 is a rectangular or substantially rectangular flat film extending in the z-direction. The eighth side conductor 918 is disposed at a position including the center CSy of the fourth side surface 904 in the y-direction. The eighth side conductor 918 defines and functions as the third terminal P3 on the circuit.

With such a configuration, it is possible to set the distance between the second terminal P2 and the third terminal P3 on the circuit to be long, and to set the distance between the first terminal P1 and the second terminal P2 to be equal or substantially equal to the distance between the first terminal P1 and the third terminal P3.

The power divider 10 further includes a resistor element 93. The resistor element 93 may be, for example, a chip electronic component or may be a predetermined conductor pattern. The resistor element 93 defines and functions as the resistor 41 on the circuit.

One end of the resistor element 93 is connected to the fifth side conductor 915 through a wiring conductor 921. The other end of the resistor element 93 is connected to the sixth side conductor 916 through a wiring conductor 922. The length of the wiring conductor 921 is preferably equal or substantially equal to the length of the wiring conductor 922.

Internal Structure of Substrate 90

As illustrated in FIGS. 5A and 6, in a plan view (when viewed in the z-direction), the power divider 10 includes a first inductor region Re21 in which the first inductor 21 is provided and a second inductor region Re22 in which the second inductor 22 is provided. The first inductor region Re21 and the second inductor region Re22 are disposed at target positions with reference to the center CSx (first reference plane) of the substrate 90 in the x-direction. Further, a spiral-shaped inductor conductor defining the first inductor 21 and a spiral-shaped inductor conductor defining the second inductor 22 have symmetrical or substantially symmetrical shapes with respect to the first reference plane. A winding direction of the spiral of the first inductor 21 and a winding direction of the spiral of the second inductor 22 are opposite to each other.

With this configuration, it is possible to set the inductance of the first inductor 21 to be equal or substantially equal to the inductance of the second inductor 22 with high accuracy.

In addition, it is possible to reduce or prevent coupling between the first inductor 21 and the second inductor 22.

In a plan view (when viewed in the z-direction), the substrate 90 includes a third inductor region Re23 in which the third inductor 23 is provided and a fourth inductor region Re24 in which the fourth inductor 24 is provided. The third inductor region Re23 and the fourth inductor region Re24 are disposed at target positions with reference to the center CSx (first reference plane) of the substrate 90 in the x-direction. Further, a spiral-shaped inductor conductor defining the third inductor 23 and a spiral-shaped inductor conductor defining the fourth inductor 24 have symmetrical or substantially symmetrical shapes with respect to the first reference plane. A winding direction of the spiral of the third inductor 23 and a winding direction of the spiral of the fourth inductor 24 are opposite to each other.

With this configuration, it is possible to set the inductance of the third inductor 23 to be equal or substantially equal to the inductance of the fourth inductor 24 with high accuracy. In addition, it is possible to reduce or prevent coupling between the third inductor 23 and the fourth inductor 24.

In addition, the first inductor region Re21 and the third inductor region Re23 are also provided on the third side surface 903 side on the first reference plane, and are disposed at target positions with reference to a second reference plane. The second inductor region Re22 and the fourth inductor region Re24 are also provided on the fourth side surface 904 side on the first reference plane, and are disposed at target positions with reference to the second reference plane.

With this configuration, it is possible to set the distance between the first side conductor 911 (first terminal P1) and the first inductor 21 to be equal or substantially equal to the distance between the first side conductor 911 and the second inductor 22. In addition, it is possible to set the distance between the third inductor 23 and the seventh side conductor 917 (second terminal P2) to be equal or substantially equal to the distance between the fourth inductor 24 and the eighth side conductor 918 (third terminal P3).

Further, it is possible to reduce the distance between the first inductor 21 and the third inductor 23 and the distance between the second inductor 22 and the fourth inductor 24, and to set the distances to be equal or substantially equal to each other.

In a plan view (when viewed in the z-direction), the substrate 90 includes a fourth capacitor region Re34 in which the fourth capacitor 34 is provided and a fifth capacitor region Re35 in which the fifth capacitor 35 is provided. The fourth capacitor region Re34 is disposed at the center or approximate center of the substrate 90 in the x-direction, and is disposed at a position closer to the second side surface 902 than the first side surface 901. The fifth capacitor region Re35 is disposed at the center or approximate center of the substrate 90 in the x-direction, and is disposed at a position closer to the first side surface 901 than the second side surface 902.

At this time, the fourth capacitor region Re34 and the fifth capacitor region Re35 do not overlap the first inductor region Re21, the second inductor region Re22, the third inductor region Re23, and the fourth inductor region Re24. Thus, an occurrence of a situation in which the magnetic fields generated by the first inductor 21, the second inductor 22, the third inductor 23, and the fourth inductor 24 are blocked by the fourth capacitor 34 and the fifth capacitor 35 is reduced or prevented. Therefore, it is easy to achieve the inductances of the first inductor 21, the second inductor 22, the third inductor 23, and the fourth inductor 24 to desired values.

Although not illustrated in FIGS. 5A to 5C, the first capacitor region in which the first capacitor 31 is provided, the second capacitor region in which the second capacitor 32 is provided, and the third capacitor region in which the third capacitor 33 is provided overlap any of the first inductor region Re21, the second inductor region Re22, the third inductor region Re23, the fourth inductor region Re24, the fourth capacitor region Re34, and the fifth capacitor regions Re35. However, as illustrated in FIG. 6, a ground conductor 90G is disposed between portions in which the first inductor region Re21, the second inductor region Re22, the third inductor region Re23, the fourth inductor region Re24, the fourth capacitor region Re34, and the fifth capacitor region Re35 are provided, and portions in which the first capacitor region, the second capacitor region, and the third capacitor region are provided. Thus, with such a configuration, it is also possible to reduce or prevent deterioration of the characteristics of each circuit element.

The distance between the fifth side conductor 915 and the seventh side conductor 917 is equal or substantially equal to the distance between the sixth side conductor 916 and the eighth side conductor 918. Thus, it is possible to set the distance between the second terminal P2 and the resistor 41 to be equal or substantially equal to the distance between the third terminal P3 and the resistor 41, on the circuit.

By using the structure of the substrate 90 and the connection configuration of the resistor element 93 as described above, it is possible to achieve the element value of each circuit element of the power divider 10 described above with high accuracy. Thus, it is possible to achieve the above-described characteristics of the power divider 10 with high accuracy.

Detailed Internal Structure of the Substrate 90

As illustrated in FIG. 6, the substrate 90 includes a plurality of insulator layers Ly0, Ly1, ..., Ly19 (referred to as Ly0 to Ly19 below), and LyD. Each of the plurality of insulator layers Ly0 to Ly19 is a rectangular or substantially rectangular flat film. Each of a plurality of insulator layers LyD is a stack of rectangular or substantially rectangular flat-film insulator layers. The insulator layer LyD may include one layer.

The plurality of insulator layers Ly0, Ly1, ..., Ly19, and LyD are stacked as follows. As illustrated in FIG. 6, from the second main surface 906 side of the substrate 90, the insulator layer Ly0 defining the second main surface 906, the insulator layer Ly1, the insulator layer LyD, and the insulator layer Ly2 are stacked in this order, and then insulator layer Ly19 defining the first main surface 905 of the substrate 90 is disposed.

Insulator Layer Ly0

A capacitor conductor 311, a capacitor conductor 321, and a capacitor conductor 331 are provided on the insulator layer Ly0. The capacitor conductor 311, the capacitor conductor 321 and the capacitor conductor 331 are each rectangular or substantially rectangular. The capacitor conductor 311 corresponds to a "first capacitor conductor", the capacitor conductor 321 corresponds to a "second capacitor conductor", and the capacitor conductor 331 corresponds to a "third capacitor conductor".

The capacitor conductor 311 is disposed to include the center in the x-direction. The capacitor conductor 321 is disposed on the third side surface 903 side of the capacitor conductor 311. The capacitor conductor 331 is disposed on the fourth side surface 904 side of the capacitor conductor 311. The capacitor conductor 311 is disposed on the first side surface 901 side of the capacitor conductor 321 and the capacitor conductor 331.

The capacitor conductor 311 is connected to the first side conductor 911. The capacitor conductor 321 is connected to the fifth side conductor 915. The capacitor conductor 331 is connected to the sixth side conductor 916.

Insulator Layer Ly1

The ground conductor 90G is provided on the insulator layer Ly1. The ground conductor 90G is provided on the entire or substantially the entire surface of the insulator layer Ly1. When viewed in the z-direction, the ground conductor 90G faces the capacitor conductor 311, the capacitor conductor 321 and the capacitor conductor 331.

The ground conductor 90G is connected to the second side conductor 912, the third side conductor 913, and the fourth side conductor 914.

Insulator Layer LyD

A conductor pattern is not provided on the insulator layer LyD, and the insulator layer LyD has a predetermined height (thickness).

Insulator Layer Ly2

A capacitor conductor 341 is provided on the insulator layer Ly2. The capacitor conductor 341 is rectangular or substantially rectangular and is disposed adjacent to or in a vicinity of the center in the x-direction. The capacitor conductor 341 is disposed at a position closer to the second side surface 902 than to the first side surface 901 in the y-direction.

Insulator Layer Ly3

A capacitor conductor 342 and a capacitor conductor 343 are provided on the insulator layer Ly3. The capacitor conductor 342 and the capacitor conductor 343 are rectangular or substantially rectangular and are disposed adjacent to or in a vicinity of the center in the x-direction. The capacitor conductor 342 and the capacitor conductor 343 are disposed at positions closer to the second side surface 902 than to the first side surface 901 in the y-direction.

The capacitor conductor 342 and the capacitor conductor 343 are arranged in the x-direction to be spaced apart from each other by a predetermined distance. Each of the capacitor conductor 342 and the capacitor conductor 343 faces the capacitor conductor 341.

The capacitor conductor 342 is connected to the fifth side conductor 915. The capacitor conductor 343 is connected to the sixth side conductor 916.

Insulator Layer Ly4

A capacitor conductor 344 is provided on the insulator layer Ly4. The capacitor conductor 344 is rectangular or substantially rectangular and is disposed adjacent to or in a vicinity of the center in the x-direction. The capacitor conductor 344 is disposed at a position closer to the second side surface 902 than to the first side surface 901 in the y-direction. The capacitor conductor 344 faces each of the capacitor conductor 342 and the capacitor conductor 343.

Insulator Layer Ly5

An inductor conductor 211, an inductor conductor 221, an inductor conductor 231, and an inductor conductor 241 are provided on the insulator layer Ly5. The inductor conductor 211, the inductor conductor 221, the inductor conductor 231, and the inductor conductor 241 are wound linear conductors.

The inductor conductor 211 is disposed at a position adjacent to or in a vicinity of the first side surface 901 and the third side surface 903. The inductor conductor 221 is disposed at a position adjacent to or in a vicinity of the first side surface 901 and the fourth side surface 904. The inductor conductor 211 and the inductor conductor 221 have symmetrical or substantially symmetrical shapes with respect to the center CSx (first reference plane) in the x-direction, and are disposed at target positions.

The inductor conductor 231 is disposed at a position adjacent to or in a vicinity of the second side surface 902 and the third side surface 903. The inductor conductor 241 is disposed at a position adjacent to or in a vicinity of the second side surface 902 and the fourth side surface 904. The inductor conductor 231 and the inductor conductor 241 have symmetrical or substantially symmetrical shapes with respect to the center CSx in the x-direction, and are disposed at target positions. The inductor conductor 211 and the inductor conductor 231 are disposed at positions which are symmetrical or substantially symmetrical with respect to the center CSy in the y-direction. The inductor conductor 221 and the inductor conductor 241 are disposed at positions which are symmetrical or substantially symmetrical with respect to the center CSy (second reference plane) in the y-direction.

The inductor conductor 211 and the inductor conductor 231 are connected. The inductor conductor 221 and the inductor conductor 241 are connected. The inductor conductor 231 is connected to the fifth side conductor 915. The inductor conductor 241 is connected to the sixth side conductor 916.

Insulator Layer Ly6

No conductor pattern is provided on the insulator layer Ly6.

Insulator Layer Ly7

An inductor conductor 212, an inductor conductor 222, an inductor conductor 232, and an inductor conductor 242 are provided on the insulator layer Ly7. The inductor conductor 212, the inductor conductor 222, the inductor conductor 232, and the inductor conductor 242 are wound linear conductors.

The inductor conductor 212 is disposed at a position adjacent to or in a vicinity of the first side surface 901 and the third side surface 903. The inductor conductor 222 is disposed at a position adjacent to or in a vicinity of the first side surface 901 and the fourth side surface 904. The inductor conductor 212 and the inductor conductor 222 have symmetrical or substantially symmetrical shapes with respect to the center CSx in the x-direction, and are disposed at target positions.

The inductor conductor 232 is disposed at a position adjacent to or in a vicinity of the second side surface 902 and the third side surface 903. The inductor conductor 242 is disposed at a position adjacent to or in a vicinity of the second side surface 902 and the fourth side surface 904. The inductor conductor 232 and the inductor conductor 242 have symmetrical or substantially symmetrical shapes with respect to the center CSx in the x-direction, and are disposed at the target positions. Further, the inductor conductor 212 and the inductor conductor 232 are disposed at positions which are symmetrical or substantially symmetrical with respect to the center CSy in the y-direction. The inductor conductor 222 and the inductor conductor 242 are disposed at positions which are symmetrical or substantially symmetrical with respect to the center CSy in the y-direction.

Insulator Layer Ly8

No conductor pattern is provided on the insulator layer Ly8.

Insulator Layer Ly9

An inductor conductor 213, an inductor conductor 223, an inductor conductor 233, and an inductor conductor 243 are provided in the insulator layer Ly9. The inductor conductor 213, the inductor conductor 223, the inductor conductor 233, and the inductor conductor 243 are wound linear conductors.

The inductor conductor 213 is disposed at a position adjacent to or in a vicinity of the first side surface 901 and the third side surface 903. The inductor conductor 223 is disposed at a position adjacent to or in a vicinity of the first side surface 901 and the fourth side surface 904. The inductor conductor 213 and the inductor conductor 223 have symmetrical or substantially symmetrical shapes with respect to the center CSx in the x-direction, and are disposed at target positions.

The inductor conductor 233 is disposed adjacent to or in a vicinity of the second side surface 902 and the third side surface 903. The inductor conductor 243 is disposed adjacent to or in a vicinity of the second side surface 902 and the fourth side surface 904. The inductor conductor 233 and the inductor conductor 243 have symmetrical or substantially symmetrical shapes with respect to the center CSx in the x-direction, and are disposed at target positions. Further, the inductor conductor 213 and the inductor conductor 233 are disposed at positions which are symmetrical or substantially symmetrical with respect to the center CSy in the y-direction. The inductor conductor 223 and the inductor conductor 243 are disposed at positions which are symmetrical or substantially symmetrical with respect to the center CSy in the y-direction.

Insulator Layer Ly10

No conductor pattern is provided on the insulator layer Ly10.

Insulator Layer Ly11

An inductor conductor 214, an inductor conductor 224, an inductor conductor 234, and an inductor conductor 244 are provided on the insulator layer Ly11. The inductor conductor 214, the inductor conductor 224, the inductor conductor 234, and the inductor conductor 244 are wound linear conductors.

The inductor conductor 214 is disposed at a position adjacent to or in a vicinity of the first side surface 901 and the third side surface 903. The inductor conductor 224 is disposed at a position adjacent to or in a vicinity of the first side surface 901 and the fourth side surface 904. The inductor conductor 213 and the inductor conductor 223 have symmetrical or substantially symmetrical shapes with respect to the center CSx in the x-direction, and are disposed at target positions.

The inductor conductor 234 is disposed at a position adjacent to or in a vicinity of the second side surface 902 and the third side surface 903. The inductor conductor 244 is disposed at a position adjacent to or in a vicinity of the second side surface 902 and the fourth side surface 904. The inductor conductor 234 and the inductor conductor 244 have symmetrical or substantially symmetrical shapes with respect to the center CSx in the x-direction, and are disposed at target positions. Further, the inductor conductor 214 and the inductor conductor 234 are disposed at positions which are symmetrical or substantially symmetrical with respect to the center CSy in the y-direction. The inductor conductor 224 and the inductor conductor 244 are disposed at positions which are symmetrical or substantially symmetrical with respect to the center CSy in the y-direction.

A wiring conductor 251 and a wiring conductor 252 are further provided on the insulator layer Ly11. The wiring conductor 251 and the wiring conductor 252 have a shape extending mainly in the x-direction. The wiring conductor 251 is disposed between the inductor conductor 214 and the inductor conductor 234, and is connected to the seventh side conductor 917. The wiring conductor 252 is disposed between the inductor conductor 224 and the inductor conductor 244, and is connected to the eighth side conductor 918.

Insulator Layer Ly12

A wiring conductor 253 is provided on the insulator layer Ly12. The wiring conductor 253 has a shape extending mainly in the x-direction, and is disposed adjacent to or in a vicinity of the first side surface 901 along the first side surface 901. A midpoint of the wiring conductor 253 in an extending direction is connected to the first side conductor 911.

Insulator Layer Ly13

A capacitor conductor 351 and a capacitor conductor 352 are provided on the insulator layer Ly13. The capacitor conductor 351 and the capacitor conductor 352 are rectangular or substantially rectangular and are disposed adjacent to or in a vicinity of the center in the x-direction. The capacitor conductor 351 and the capacitor conductor 352 are disposed at positions closer to the first side surface 901 than the second side surface 902 in the y-direction.

The capacitor conductor 351 and the capacitor conductor 352 are disposed in the x-direction and spaced apart from each other by a predetermined distance.

Insulator Layer Ly14

No conductor pattern is provided on the insulator layer Ly14.

Insulator Layer Ly15

A capacitor conductor 353 is provided on the insulator layer Ly15. The capacitor conductor 353 is disposed adjacent to or in a vicinity of the center in the x-direction. The capacitor conductor 353 is disposed at a position closer to the first side surface 901 than to the second side surface 902 in the y-direction.

A portion of the capacitor conductor 353 faces the capacitor conductor 351 and the capacitor conductor 352.

Insulator Layer Ly16

No conductor pattern is provided on the insulator layer Ly16.

Insulator Layer Ly17

A capacitor conductor 354 and a capacitor conductor 355 are provided on the insulator layer Ly17. The capacitor conductor 354 and the capacitor conductor 355 are rectangular or substantially rectangular and are disposed adjacent to or in a vicinity of the center in the x-direction. The capacitor conductor 354 and the capacitor conductor 355 are disposed at positions closer to the first side surface 901 than to the second side surface 902 in the y-direction.

The capacitor conductor 354 and the capacitor conductor 355 are disposed in the x-direction and spaced apart from each other by a predetermined distance.

The capacitor conductor 354 faces the capacitor conductor 351. The capacitor conductor 355 faces the capacitor conductor 352.

Insulator Layer Ly18

A capacitor conductor 356 is provided on the insulator layer Ly18. The capacitor conductor 356 is disposed adjacent to or in a vicinity of the center in the x-direction. The capacitor conductor 356 is disposed at a position closer to the first side surface 901 than to the second side surface 902 in the y-direction.

The capacitor conductor 356 faces the capacitor conductor 354 and the capacitor conductor 355.

Insulator Layer Ly19

No conductor pattern is provided on the insulator layer Ly19.

With the above configuration, the capacitor conductor 311 and the ground conductor 90G face each other with the insulator layer interposed therebetween, to define the first capacitor 31 on the circuit. The capacitor conductor 311 and the ground conductor 90G correspond to the "first capacitor conductor".

The capacitor conductor 321 and the ground conductor 90G face each other with the insulator layer interposed therebetween, to define the second capacitor 32 on the circuit. The capacitor conductor 321 and the ground conductor 90G correspond to the "second capacitor conductor".

The capacitor conductor 331 and the ground conductor 90G face each other with the insulator layer interposed therebetween, to define the third capacitor 33 on the circuit. The capacitor conductor 331 and the ground conductor 90G correspond to the "third capacitor conductor".

The fourth capacitor 34 on the circuit is provided in a manner that the capacitor conductor 341 faces the capacitor conductor 344 with the insulator layer interposed therebetween, and the capacitor conductor 342 faces the capacitor conductor 343 with the insulator layer interposed therebetween. The capacitor conductor 341, the capacitor conductor 342, the capacitor conductor 343, and the capacitor conductor 344 correspond to a "fourth capacitor conductor".

The fifth capacitor 35 on the circuit is provided in a manner that the capacitor conductor 351, the capacitor conductor 353, the capacitor conductor 354, and the capacitor conductor 356 face each other with the insulator layers interposed therebetween, and the capacitor conductor 352, the capacitor conductor 353, the capacitor conductor 355, and the capacitor conductor 356 face each other with the insulator layers interposed therebetween. The capacitor conductor 351, the capacitor conductor 352, the capacitor conductor 353, the capacitor conductor 354, the capacitor conductor 355, and the capacitor conductor 356 correspond to a "fifth capacitor conductor".

The central opening of the inductor conductor 211, the central opening of the inductor conductor 212, the central opening of the inductor conductor 213, and the opening of the inductor conductor 214 overlap each other. Further, the inductor conductor 211, the inductor conductor 212, the inductor conductor 213, and the inductor conductor 214 are connected in this order by interlayer connection conductors. Thus, the spiral first inductor 21 is provided. The inductor conductor 211, the inductor conductor 212, the inductor conductor 213, and the inductor conductor 214 correspond to a "first inductor conductor".

The central opening of the inductor conductor 221, the central opening of the inductor conductor 222, the central opening of the inductor conductor 223, and the opening of the inductor conductor 224 overlap each other. Further, the inductor conductor 221, the inductor conductor 222, the inductor conductor 223, and the inductor conductor 224 are connected in this order by interlayer connection conductors. Thus, the spiral second inductor 22 is provided. The inductor conductor 221, the inductor conductor 222, the inductor conductor 223, and the inductor conductor 224 correspond to a "second inductor conductor".

The central opening of the inductor conductor 231, the central opening of the inductor conductor 232, the central opening of the inductor conductor 233, and the opening of the inductor conductor 234 overlap each other. Further, the inductor conductor 231, the inductor conductor 232, the inductor conductor 233, and the inductor conductor 234 are connected in this order by interlayer connection conductors. Thus, the spiral third inductor 23 is provided. The inductor conductor 231, the inductor conductor 232, the inductor conductor 233, and the inductor conductor 234 correspond to a "third inductor conductor".

The central opening of the inductor conductor 241, the central opening of the inductor conductor 242, the central opening of the inductor conductor 243, and the opening of the inductor conductor 244 overlap each other. Further, the inductor conductor 241, the inductor conductor 242, the inductor conductor 243, and the inductor conductor 244 are connected in this order by interlayer connection conductors. Thus, the spiral fourth inductor 24 is provided. The inductor conductor 241, the inductor conductor 242, the inductor conductor 243, and the inductor conductor 244 correspond to a "fourth inductor conductor".

With this configuration, it is possible to easily obtain the above-described circuit illustrated in FIG. 1 from the substrate 90, the resistor element 93, the wiring conductor 921, and the wiring conductor 922.

Further, with this configuration, as illustrated in FIG. 6, the layer in which the fifth capacitor region Re35 is provided, and the layer in which the fourth capacitor region Re34 is provided are further arranged to sandwich the layer in which the first inductor region Re21, the second inductor region Re22, the third inductor region Re23, and the fourth inductor region Re24 are formed. Thus, it is possible to reduce or prevent the coupling between the fourth capacitor 34 and the fifth capacitor 35.

In addition, with this configuration, as illustrated in FIG. 6, the insulator layer LyD on which no conductor pattern is provided is further disposed between the layer in which the fourth capacitor region Re34 is provided and the ground conductor 90G. Thus, it is possible to reduce or prevent the coupling between the fourth capacitor 34 and the ground conductor 90G.

In the substrate 90 of the power divider 10, in the z-direction, the fourth capacitor region Re34 and the fifth capacitor region Re35 may be disposed on the same side as the layer in which the first inductor region Re21, the second inductor region Re22, the third inductor region Re23, and the fourth inductor region Re24 are provided.

Further, in the power divider 10, it is possible to mount the resistor element 93 on the first main surface 905 of the substrate 90, and to mount the resistor element 93 in the substrate 90.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power divider comprising:
    a first terminal, a second terminal, and a third terminal;
    a first inductor connected between the first terminal and the second terminal;
    a second inductor connected between the first terminal and the third terminal;
    a first capacitor connected between a second terminal side of the first inductor and a ground;
    a second capacitor connected between a third terminal side of the second inductor and the ground;
    a third capacitor connected between the first terminal and the ground;
    a resistor connected between the second terminal side of the first inductor and the third terminal side of the second inductor;
    a third inductor connected between a connection portion between the first inductor and the resistor, and the second terminal;

a fourth inductor connected between a connection portion between the second inductor and the resistor, and the third terminal;
a fourth capacitor connected in parallel with the resistor; and
a fifth capacitor connected between the second terminal and the third terminal; wherein
the resistor is the only resistor connected between the second terminal side of the first inductor and the third terminal side of the second inductor.

2. The power divider according to claim 1, wherein the power divider includes:
a first circuit including the first inductor, the second inductor, the resistor, the first capacitor, the second capacitor, and the third capacitor; and
a second circuit including the third inductor, the fourth inductor, the fourth capacitor, and the fifth capacitor; and
an element value of the first circuit and an element value of the second circuit define one or two attenuation poles by the first circuit and the second circuit.

3. The power divider according to claim 1, further comprising:
a laminate including a plurality of insulator layers that are laminated and a circuit conductor pattern; and
a plurality of terminal conductors connecting the circuit conductor pattern to an outside; wherein
in the laminate, the first inductor, the second inductor, the third inductor, the fourth inductor, the first capacitor, the second capacitor, the third capacitor, the fourth capacitor, and the fifth capacitor are defined by the circuit conductor pattern;
the resistor is defined by a resistor portion separate from the laminate; and
the resistor portion is connected to the laminate through two of the plurality of terminal conductors.

4. The power divider according to claim 3, wherein the laminate includes:
a first main surface and a second main surface perpendicular or substantially perpendicular to a laminating direction and facing each other;
a first side surface and a second side surface parallel or substantially parallel to the laminating direction and facing each other; and
a third side surface and a fourth side surface parallel or substantially parallel to the laminating direction and perpendicular or substantially perpendicular to the first side surface and the second side surface, and facing each other;
the plurality of terminal conductors include:
a first terminal conductor defining the first terminal;
a second terminal conductor defining the second terminal; and
a third terminal conductor defining the third terminal;
when a direction parallel or substantially parallel to the first side surface and the second side surface is set to an x-direction, and a direction parallel or substantially parallel to the third side surface and the fourth side surface is set to a y-direction, the first terminal conductor is at a position including a center of the first side surface in the x-direction, and the second terminal conductor and the third terminal conductor are located at symmetrical or substantially symmetrical positions with respect to a first reference plane that passes through the center in the x-direction and is parallel or substantially parallel to the y-direction.

5. The power divider according to claim 4, wherein the laminate includes:
a first inductor conductor defining the first inductor;
a second inductor conductor defining the second inductor;
a third inductor conductor defining the third inductor; and
a fourth inductor conductor defining the fourth inductor;
the first inductor conductor and the second inductor conductor are symmetrical or substantially symmetrical with respect to the first reference plane; and
the third inductor conductor and the fourth inductor conductor are symmetrical or substantially symmetrical with respect to the first reference plane.

6. The power divider according to claim 5, wherein in the laminating direction, a spiral winding direction of the first inductor conductor is opposite to a spiral winding direction of the second inductor conductor, and a spiral winding direction of the third inductor conductor is opposite to a spiral winding direction of the fourth inductor conductor.

7. The power divider according to claim 5, wherein the circuit conductor pattern includes:
a fourth capacitor conductor defining the fourth capacitor; and
a fifth capacitor conductor defining the fifth capacitor;
the first inductor conductor, the second inductor conductor, the third inductor conductor, and the fourth inductor conductor are wound in the laminating direction; and
the fourth capacitor conductor and the fifth capacitor conductor are at positions that include the center in the x-direction and do not overlap an opening portion of the first inductor conductor, an opening portion of the second inductor conductor, an opening portion of the third inductor conductor, and an opening portion of the fourth inductor conductor.

8. The power divider according to claim 7, wherein an insulator layer on which the fourth capacitor conductor is provided is different from an insulator layer on which the fifth capacitor conductor is provided; and
the insulator layer on which the fourth capacitor conductor is provided and the insulator layer on which the fifth capacitor conductor is provided are at positions that sandwich an insulator layer on which the first inductor conductor, the second inductor conductor, third inductor conductor, and the fourth inductor conductor are provided, in the laminating direction.

9. The power divider according to claim 7, wherein an insulator layer on which a first capacitor conductor defining the first capacitor is provided, an insulator layer on which a second capacitor conductor defining the second capacitor is provided, and an insulator layer on which a third capacitor conductor defining the third capacitor is provided are on a same side as the insulator layer on which the fourth capacitor conductor is provided, with respect to the insulator layer on which the first inductor conductor, the second inductor conductor, the third inductor conductor, and the fourth inductor conductor are provided, in the laminating direction; and
a ground conductor is between the insulator layer on which the first capacitor conductor is provided, the insulator layer on which the second capacitor conductor is provided, and the insulator layer on which the third capacitor conductor is provided, and the insulator layer on which the fourth capacitor conductor is provided.

10. The power divider according to claim 9, wherein in the laminating direction, an insulator layer on which no conductor pattern is provided is between the insulator layer on which the first inductor conductor, the second inductor conductor, the third inductor conductor, and the fourth inductor conductor are provided, and the insulator layer on which the ground conductor is provided.

11. A power divider comprising:
a laminate including a plurality of insulator layers that are laminated and a circuit conductor pattern; and
a plurality of terminal conductors connecting the circuit conductor pattern to an outside and respectively define a first terminal, a second terminal, a third terminal, and a plurality of resistor connection terminals; wherein
the circuit conductor pattern includes:
    a first inductor conductor connected between the first terminal and the second terminal;
    a second inductor conductor connected between the first terminal and the third terminal;
    a first capacitor conductor connected between the second terminal and a ground conductor;
    a second capacitor conductor connected between the third terminal and the ground conductor;
    a third capacitor conductor connected between the first terminal and the ground conductor;
    a third inductor conductor between a connection portion between the first inductor conductor and a resistor, and the second terminal;
    a fourth inductor conductor connected between a connection portion between the second inductor conductor and the resistor, and the third terminal;
    a fourth capacitor conductor connected in parallel with the resistor; and
    a fifth capacitor conductor connected between the second terminal and the third terminal; and
the resistor is separate from the laminate, is between the second terminal and the third terminal in one direction of the laminate, and is connected to the laminate through the plurality of resistor connection terminals.

12. The power divider according to claim 11, wherein the laminate includes:
    a first main surface and a second main surface perpendicular or substantially perpendicular to a laminating direction and facing each other;
    a first side surface and a second side surface parallel or substantially parallel to the laminating direction and facing each other; and
    a third side surface and a fourth side surface parallel or substantially parallel to the laminating direction and perpendicular or substantially perpendicular to the first side surface and the second side surface, and facing each other;
    when a direction parallel or substantially parallel to the first side surface and the second side surface is set to an x-direction, and a direction parallel or substantially parallel to the third side surface and the fourth side surface is set to a y-direction, the first terminal is at a position including a center of the first side surface in the x-direction, and the second terminal and the third terminal are at symmetrical or substantially symmetrical positions with respect to a first reference plane that passes through the center in the x-direction and is parallel or substantially parallel to the y-direction.

13. The power divider according to claim 12, wherein
    the first inductor conductor and the second inductor conductor are symmetrical or substantially symmetrical with respect to the first reference plane; and
    the third inductor conductor and the fourth inductor conductor are symmetrical or substantially symmetrical with respect to the first reference plane.

14. The power divider according to claim 13, wherein in the laminating direction, a spiral winding direction of the first inductor conductor is opposite to a spiral winding direction of the second inductor conductor, and a spiral winding direction of the third inductor conductor is opposite to a spiral winding direction of the fourth inductor conductor.

15. The power divider according to claim 13, wherein
    the first inductor conductor, the second inductor conductor, the third inductor conductor, and the fourth inductor conductor are wound in the laminating direction; and
    the fourth capacitor conductor and the fifth capacitor conductor are at positions that include the center in the x-direction and do not overlap an opening portion of the first inductor conductor, an opening portion of the second inductor conductor, an opening portion of the third inductor conductor, and an opening portion of the fourth inductor conductor.

16. The power divider according to claim 15, wherein
an insulator layer on which the fourth capacitor conductor is provided is different from an insulator layer on which the fifth capacitor conductor is provided; and
the insulator layer on which the fourth capacitor conductor is provided and the insulator layer on which the fifth capacitor conductor is provided are at positions that sandwich an insulator layer on which the first inductor conductor, the second inductor conductor, third inductor conductor, and the fourth inductor conductor are provided, in the laminating direction.

17. The power divider according to claim 15, wherein
an insulator layer on which the first capacitor conductor is provided, an insulator layer on which the second capacitor conductor is provided, and an insulator layer on which the third capacitor conductor is provided are on a same side as the insulator layer on which the fourth capacitor conductor is provided, with respect to the insulator layer on which the first inductor conductor, the second inductor conductor, the third inductor conductor, and the fourth inductor conductor are provided, in the laminating direction; and
a ground conductor is between the insulator layer on which the first capacitor conductor is provided, the insulator layer on which the second capacitor conductor is provided, and the insulator layer on which the third capacitor conductor is provided, and the insulator layer on which the fourth capacitor conductor is provided.

18. The power divider according to claim 17, wherein in the laminating direction, an insulator layer on which no conductor pattern is provided is between the insulator layer on which the first inductor conductor, the second inductor conductor, the third inductor conductor, and the fourth inductor conductor are provided, and the insulator layer on which the ground conductor is provided.

* * * * *